METHOD OF PRODUCING SEMICONDUCTOR DEVICES

Filed Aug. 21, 1967 4 Sheets-Sheet 1

INVENTORS.
NINO P. CERNIGLIA
and RICHARD C. TONNER

BY David M. Keay

AGENT.

METHOD OF PRODUCING SEMICONDUCTOR DEVICES

Filed Aug. 21, 1967 4 Sheets-Sheet 2

INVENTORS.
NINO P. CERNIGLIA
and RICHARD C. TONNER

BY David M. Keay

AGENT.

METHOD OF PRODUCING SEMICONDUCTOR DEVICES

Filed Aug. 21, 1967 4 Sheets-Sheet 3

INVENTORS.
NINO P. CERNIGLIA
and RICHARD C. TONNER

BY David M. Keay

AGENT.

Sept. 2, 1969 R. C. TONNER ET AL 3,464,104

METHOD OF PRODUCING SEMICONDUCTOR DEVICES

Filed Aug. 21, 1967 4 Sheets-Sheet 4

INVENTORS.
NINO P. CERNIGLIA
and RICHARD C. TONNER

BY David M. Kay

AGENT.

United States Patent Office 3,464,104

Patented Sept. 2, 1969

3,464,104

METHOD OF PRODUCING SEMICONDUCTOR DEVICES

Richard C. Tonner, Braintree, and Nino P. Cerniglia, Revere, Mass., assignors to Sylvania Electric Products Inc., a corporation of Delaware Filed Aug. 21, 1967, Ser. No. 661,995

Int. Cl. B01j *17/00;* H01l *7/00*

U.S. Cl. 29—582 12 Claims

ABSTRACT OF THE DISCLOSURE

Semiconductor elements formed in a wafer and held in fixed position with respect to each other by the wafer material or the supporting structure of an array are frozen to a thermo-electric cooling block by an intervening layer of a frozen fluid. While the elements are frozen to the block, the material or structure holding one or more of the elements in the wafer or array is removed or severed. An individual semiconductor element is then removed from adjacent others by means of a heated vacuum pick-up tool which melts the frozen fluid contacting the element.

BACKGROUND OF THE INVENTION

This invention relates to semiconductor electrical translating devices. More particularly, it is concerned with methods of manufacturing, handling, and mounting semiconductor elements.

Present techniques of diffusing conductivity type imparting materials through small, precisely defined openings in protective coatings (typically silicon oxide) on bodies of semiconductor material (typically silicon) have made possible the fabrication of semiconductor devices such as diodes, transistors, and integrated circuit networks of exceptionally small size. By employing these processing techniques the electrically active zones of a large number of devices are fabricated simultaneously in a single wafer of semiconductor material.

After the formation of the electrically active zones, the wafer is divided into individual dice, each containing the electrically active zones of a semiconductor device. Typically, from this point on, each die is processed as an individual unit. Each die is individually manipulated, oriented, properly positioned on a suitable mounting header, such as a part of an enclosure or a circuit board, and then bonded in place with appropriate electrical connections provided between the active zones and the conductive members of the header.

SUMMARY OF THE INVENTION

The present invention provides an improved method of maintaining a plurality of semiconductor elements in fixed position with respect to each other while individual elements are selectively removed from adjacent the other elements as for mounting on headers. In accordance with the method of the invention a plurality of semiconductor elements which are supported in fixed position with respect to each other by supporting means are placed on a supporting member with a fluid medium lying between the supporting member and the semiconductor elements. The fluid medium is frozen thereby holding the plurality of semiconductor elements in fixed position with respect to the supporting member. Then a semiconductor element is separated from the supporting means supporting the element with respect to the other semiconductor elements of the plurality whereby the semiconductor element is held in fixed position with respect to the supporting member only by the frozen fluid medium. The frozen fluid medium holding the semiconductor element to the supporting member is melted, and the semiconductor element is moved from adjacent the plurality of semiconductor elements. The semiconductor element may be transferred to a mounting header and then bonded to the header. During this procedure the frozen fluid medium holds the other semiconductor elements of the plurality fixed in position with respect to the supporting member.

BRIEF DESCRIPTION OF THE DRAWINGS

Various objects, features, and advantages of the method of the invention will be apparent from the following detailed discussion and the accompanying drawings wherein.

Figures 1, 2:
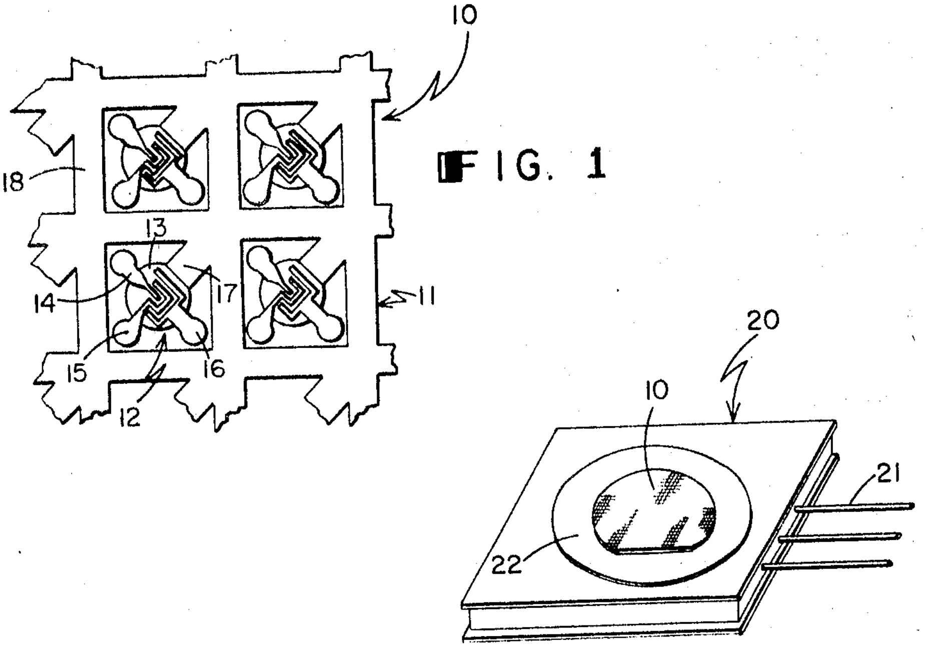
FIG. 1 is a plan view of a fragment of an array of semiconductor elements comprising a plurality of semiconductor dice held in fixed relationship by a supporting grid structure of beam-lead members.
FIG. 2 is a perspective view of the array of elements of FIG. 1 frozen to a thermo-electric supporting block.

Because of the extremely small size of various portions of the items illustrated in the drawings some of the dimensions of many of the items have been exaggerated with respect to other dimensions. It is believed that greater clarity of presentation is thereby obtained despite consequent distortion of items in relation to their actual physical appearance.

DESCRIPTION OF THE PREFERRED EMBODIMENTS

An array of semiconductor elements 10 which may be employed in carrying out a first embodiment of the invention is illustrated in FIG. 1. The array is formed from a wafer of semiconductor material, for example, silicon. Conductivity type imparting materials are diffused into the wafer through openings in silicon oxide coatings on the surface of the wafer to form zones of opposite conductivity types. Each group of zones is the electrically active zones of a semiconductor device, and the groups are evenly distributed in a regular pattern over the surface of the wafer. For illustrative purposes, each group of zones is the electrically active zones of a transistor.

A network of conductive supporting beam leads 11 is formed on the surface of the oxide coated silicon wafer in the pattern illustrated in FIG. 1. The adherent supporting beam network is produced on the wafer as by the method of forming connecting leads described and claimed in copending application Ser. No. 658,427, filed Aug. 4, 1967, by the applicants of the present application entitled "Method of Forming Leads on Semiconductor Devices" and assigned to the assignee of the present invention.

Upon completion of the beam-lead network, the silicon material of the wafer is removed except for portions containing the active zones of semiconductor elements. This procedure may be accomplished by mounting the wafer with the beam-leaded surface against a suitable supporting block. Then the thickness of the entire wafer is reduced by lapping the exposed undersurfaces of the wafer or by immersing the assembly in a suitable etching solution which dissolves silicon. After the wafer has been reduced to the desired thickness, the undersurface of the wafer is masked with a suitable protective material to protect the electrically active zones of each semiconductor element and the assembly is immersed in a suitable etching solution to dissolve all the unprotected silicon.

Each semiconductor element 12 of the resulting array as shown in FIG. 1 includes a die 13 of silicon having a group of three active zones enabling the element to function as a transistor. Conductive beam leads 14, 15, and 16 which adhere to the surface of each die and project from the die make contact through openings in the oxide coating to underlying active zones thereby providing electrical connections to the emitter, base, and collector zones, respectively.

A fourth beam lead 17 also adheres to the surface of each die but is not electrically connected to semiconductor material underlying the oxide coating. The fourth beam leads 17 extend to a supporting grid 18 which is also part of the beam-lead network 11 thereby supporting each semiconductor element in position with respect to the supporting grid and the other semiconductor elements of the array. The supporting grid 18 is composed of two sets of parallel beams intersecting at right angles. A semiconductor die is located centrally of each opening formed by the intersection sets of beams, producing a regular two-dimensional array of substantially identical semiconductor elements arranged in a square pattern of even rows and columns.

The array of semiconductor elements 10 is mounted on a thermo-electric supporting block 20 as illustrated in FIG. 2. The block includes a cooling element which employs the Peltier effect to reduce the temperature at the surface of the block when electrical current flows through the leads 21. A layer of a fluid medium is first placed on the upper surface of the thermo-electric supporting block. The fluid medium may be a film of water or, as shown in FIG. 2, a piece of porous filter paper impregnated with water 22 may be employed. Other inert fluid materials, for example Freon, may also be used. The wet filter paper 22 is placed on the surface of the block 20 and the array of semiconductor elements 10 is placed on the filter paper with its beam-leaded surface against the filter paper. Current is passed through the leads 21 of the block causing the water to freeze thereby fixing each of the semiconductor elements of the array in position with respect to the supporting block.

Figure 3:
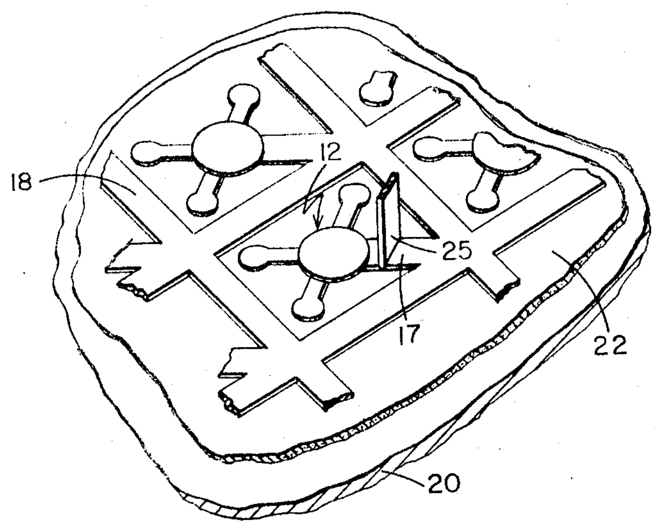
FIG. 3 is a perspective view illustrating the step of separating a semiconductor element from the supporting grid by severing the beam-lead member supporting the element in the array.

The thermo-electric block 20 with the array of semiconductor elements frozen to its upper surface is placed in a suitable mounting apparatus (not shown) which operates in conjunction with a cutting tool 25 as shown in FIG. 3. The thermo-electric block 20 or the cutting tool 25 is maneuvered so that when the cutting tool is lowered, it severs a fourth beam lead 17 thus separating the associated element 12 from the supporting grid 18. The semiconductor element remains fixed to the thermo-electric block by the frozen fluid medium 22.

Figure 4:
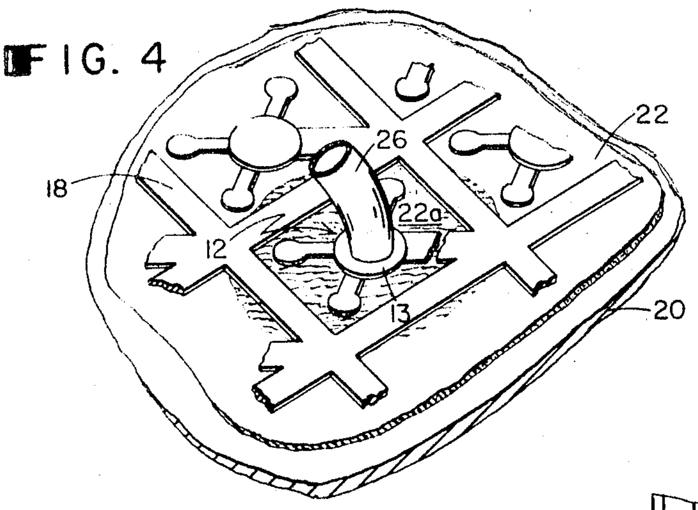
FIG. 4 is a perspective view illustrating the semiconductor element being removed from the array by a heated pick-up tool which melts the frozen fluid medium holding the element to the supporting block.

After the supporting beam lead 17 has been severed, the cutting tool 25 is retracted and a vacuum pick-up tool 26 is lowered into contact with a semiconductor element as illustrated in FIG. 4. The pick-up tool 26 is heated by a suitable means (not shown) so that when the pick-up tool contacts the semiconductor die 13, heat is transmitted from the tool through the die to the frozen fluid medium in contact with the die and holding it fixed in position on the thermo-electric block. The portion of the medium immediately adjacent the die, designated as **22*a* in FIG. 4, melts freeing the semiconductor element from the thermoelectric block 20. The pick-up tool 26 can then be manipulated to move the semiconductor element 12** gripped by the tool away from the other semiconductor elements of the array. The remainder of the medium remains frozen holding all the other semiconductor elements fixed in position with respect to the thermo-electric block, and the molten portion refreezes when the heated tool is withdrawn.

Figure 5:
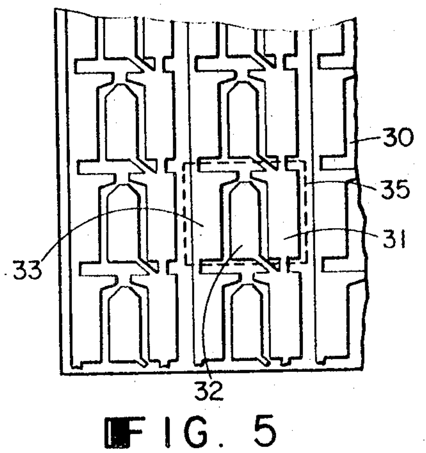
FIG. 5 is a plan view of a fragment of an array of mounting headers showing several groups of conductive regions to which semiconductor elements of the array are to be attached.

The semiconductor element may be transferred to a suitable mounting header, for example, one of the headers of an array as shown in FIG. 5. The array of headers illustrated includes a flat plate or board 30 of nonconductive material having a plurality of groups of conductive regions 31, 32, and 33 on one surface. The array may be produced as in the manner of fabricating circuit boards in which a clad metal layer, as of copper, on an insulating board is selectively removed to leave a desired pattern of conductive regions. The board is then suitably plated to provide a surface layer of gold on the conductive regions.

Each group of conductive regions together with the portion of the insulating board to which it adheres provides a mounting header, one of which is delineated by the dashed line 35 in FIG. 5. The configuration and spacing of the conductive regions of each group is such that they will accommodate the beam-lead contact members of a semiconductor element and provide conductive paths to the active zones of the element. As shown, the substantially identical groups of conductive regions are located on the insulating board to provide a regular two-dimensional array of mounting headers arranged in a square pattern of even rows and columns.

Although each header of the array as shown is suitable for mounting a single semiconductor element, each mounting header may include an arrangement of conductive regions to accommodate two or more semiconductor elements and also other components. That is, the array of mounting headers could be an array of circuit boards.

Figure 6:
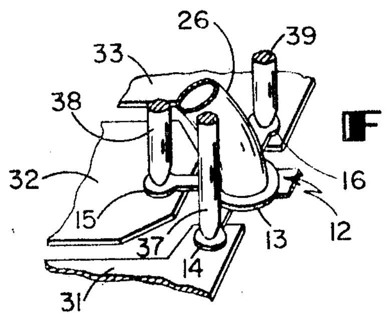
FIG. 6 is a perspective view illustrating a semiconductor element transferred from the array of elements and being bonded to a mounting header of the array.

The semiconductor element 12 is carried to a particular header of the array by the pick-up tool 26 and placed on the header with portions of the beam-lead contact members 14, 15, and 16 in contact with the conductive regions 31, 32, and 33, respectively, as illustrated in FIG. 6. While the pick-up tool 26 holds the semiconductor element in position, bonding tools 37, 38, and 39 are lowered and the beam-lead contact members are bonded to the mating conductive regions of the header. The bonds may be made simultaneously, or one bond may be completed, the pick-up tool retracted, and then the remaining bonds made simultaneously or successively.

The foregoing procedure is repeated continually to produce an array of mounted semiconductor elements. The apparatus supporting the thermo-electric block, the apparatus supporting the array of headers, the cutting tool, the pick-up tool, and the bonding tools are appropriately indexed and maneuvered with respect to each other to remove the semiconductor elements in succession from the array and bond them to successive groups of conductive regions. Alternatively, all the fourth beam leads 17 supporting the semiconductor elements in the supporting grid 18 may be severed in one apparatus and then the thermo-electric block placed in another apparatus at which the semiconductor elements are individually melted free of the block and transferred to the array of headers.

Figure 7:
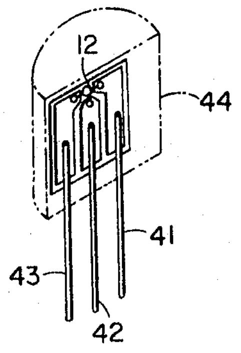
FIG. 7 is a perspective view of a completed semiconductor device with the outline of the solidified encapsulating material of the device enclosure indicated in phantom.

The insulating board 30 is then cut into individual headers and lead wires 41, 42, and 43 are attached to the conductive regions as by welding. Each of the headers and its mounted semiconductor element 12 is then encapsulated in a suitable plastic material. FIG. 7 illustrates a semiconductor element, individual header, and lead wires as embedded in a solid plastic enclosure 44, indicated in phantom, to provide a completed device.

Figure 8:
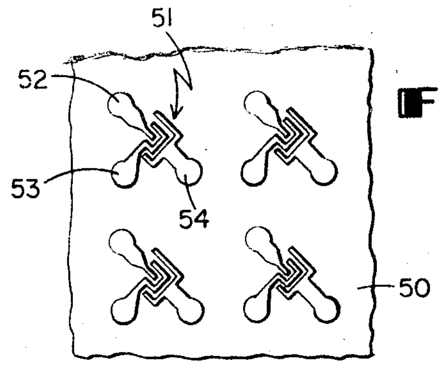
FIG. 8 is a plan view of a fragment of a wafer of silicon, within which the electrically active zones of a plurality of semiconductor transistors have been formed, for use in a modification of the method of the invention.

A modification of the method of the invention employs a wafer of silicon 50 having a plurality of identical semiconductor elements 51 fabricated therein as shown in FIG. 8. The electrically active zones of the semiconductor elements are formed by diffusing conductivity type imparting materials into the wafer through openings in oxide coatings on the upper surface of the wafer to produce zones of opposite conductivity types. For illustrative purposes, each group of zones is the electrically active zones of a transistor. Each group of zones occupies a region of the wafer, and the regions are evenly distributed in a regular pattern over the wafer.

Beam-lead contact members 52, 53, and 54 on the surface of the oxide coated silicon wafer make contact to the underlying active zones through openings in the oxide coating. The beam leads are formed on the wafer as by the method of forming leads described in the aforementioned copending application of the applicants.

The wafer is mounted with its upper surface against a suitable block. Then the thickness of the entire wafer is reduced by lapping the exposed undersurface of the wafer or by immersing the assembly in a suitable etching solution. After the wafer has been reduced to the desired thickness, it is removed from the block. The undersurface of the wafer is masked with a suitable protective material to protect only the regions of the wafer containing the electrically active zones of semiconductor elements.

Figure 9:
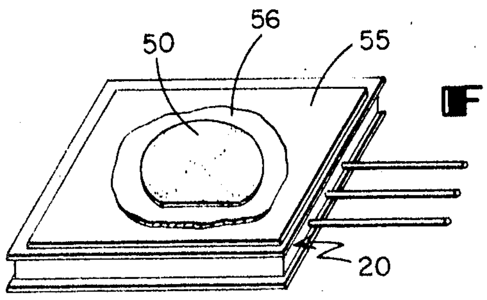
FIG. 9 is a perspective view of the wafer of silicon of FIG. 8 frozen to a substrate by means of a thermo-electric block.

The wafter 50 is then frozen to supporting substrate 55 of a suitable inert material, sapphire for example, as illustrated in FIG. 9. The substrate 55 is placed on the surface of a thermo-electric cooling block 20 of the type previously described. A fluid medium 56, for example a film of water or other suitable liquid, is placed on the surface of the substrate. The wafer 50 is placed on the film of water with the beam-leaded surface downward. Current flow through the thermo-electric block cools the assembly thereby freezing the wafer to the substrate.

Figure 10:
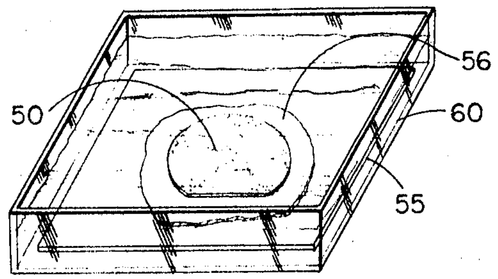
FIG. 10 is a perspective view of the wafer frozen to the substrate being treated in an etching bath to dissolve silicon and leave individual dice frozen to the substrate.

The assembly of the substrate 55 and wafer 50 is transferred from the thermo-electric cooling block to a suitable silicon etching bath 60 maintained at a temperature below the freezing temperature of the fluid medium as illustrated in FIG. 10. For example, a mixture of 210 cubic centimeters of 48 percent by weight hydrogen fluoride solution, 560 cubic centimeters of C.P. grade nitric acid, 210 cubic centimeters of glacial acetic acid, and 14 cubic centimeters of 1 percent by weight silver nitrate solution at a temperature of about −10° C. may be used. The assembly is immersed in the etching solution until all the unprotected silicon is dissolved.

Figure 11:
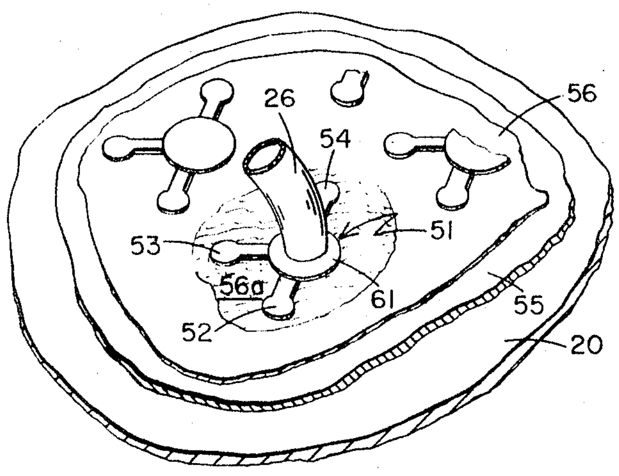
FIG. 11 is a perspective view illustrating a semiconductor element being removed from the vicinity of the other elements by a heated pick-up tool.

As shown in FIG. 11 each of the resulting plurality of semiconductor elements 51 includes a discrete die 61 of silicon containing a group of electrically active zones constituting a transistor. Contact members 52, 53, and 54 make contact to the active zones thereby providing electrical connections to the emitter, base, and collector zones, respectively, of each element.

The substrate 55 with each die fixed thereto is returned to the thermo-electric block 20 before any significant thawing of the frozen fluid medium takes place.

The thermo-electric supporting block 20 is mounted in a suitable apparatus for holding the plurality of dice while individual dice are transfererd to mounting headers as of the type illustrated in FIG. 5.

As illustrated in FIG. 11 a heated vacuum pick-up tool 26 is placed in contact with a semiconductor die 61 to cause localized heating of the ice in contact with the element. Heat is transmitted from the tool through the die to the adjacent ice causing it to melt, designated as **56*a*, and free the semiconductor element from the substrate 55. The semiconductor element 51** is then transferred to the array of headers and bonded to the conductive regions of a header in the same manner as previously explained and illustrated in FIG. 6.

The foregoing procedure of transferring semiconductor elements to headers is repeated continually to produce an array of mounted semiconductor elements. The apparatus supporting the thermo-electric block, the apparatus supporting the array of headers, the pick-up tool, and the bonding tools are appropriately indexed and maneuvered with respect to each other to remove the semiconductor elements in succession from the substrate and bond them to successive groups of conductive regions. The headers and bonded elements may then be further processed in the manner described previously to produce complete semiconductor devices as illustrated in FIG. 7.

Figure 12:
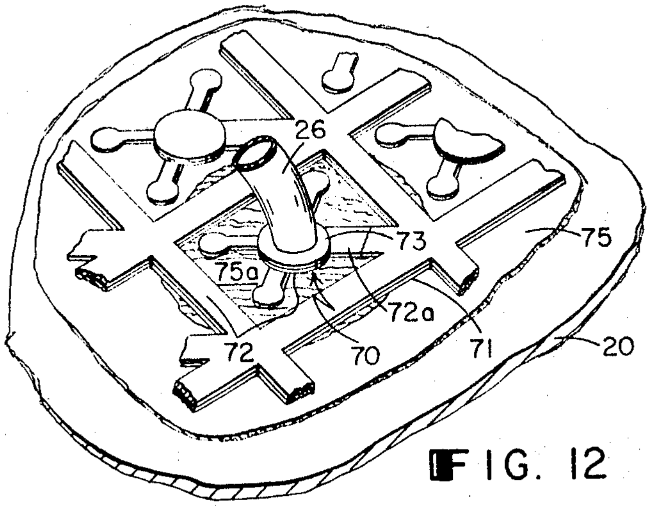
FIG. 12 is a perspective view illustrating a semiconductor element being separated from an array and from a supporting block in accordance with a variation of the method of the invention.

FIG. 12 illustrates a variation in the method of the invention wherein the step of severing the supporting structuer holding a semiconductor element 70 in an array and the step of melting the frozen fluid medium holding the element fixed to the supporting block 20 are accomplished substantially simultaneously. The array of semiconductor elements as illustrated may be fabricated in accordance with the method disclosed and claimed in copending application Ser. No. 635,905, filed May 3, 1967, by Allen G. Baker and Brian Dale entitled "Method of Producing Semiconductor Devices" and assigned to the assignee of the present invention. In accordance with the teachings in that application semiconductor elements 70 may be held in a supporting network of beam leads 71 by a segment **72*a* of the silicon oxide layer 72 which is adherent to the surface of the silicon die 73 and to the beam leads 71 of the supporting network. The array may be frozen to a thermo-electric supporting block 20 by means of a sheet of water impregnated filter paper 75** lying between the block and the array as explained previously.

In order to remove a semiconductor element 70 from the array a heated vacuum pick-up tool 26 is brought into engagement with the silicon die 73. Heat is transmitted through the die melting the ice in the vicinity of the semiconductor element, designated as **75*a*. At the same time, downward pressure of the tool causes the oxide segment 72*a* supporting the element in the array to break. The semiconductor element 70 is thereby freed from the supporting block 20** and the array in a single operation and can be removed by the vacuum pick-up tool.

In the production of semiconductor devices according to the invention handling, orienting, and manipulating of individual semiconductor elements are greatly simplified or avoided. Semiconductor elements are separated into individual, discrete units while being held in fixed position with respect to each other, and each is maintained in fixed relationship to the other elements by the frozen fluid medium until it is individually separated from the supporting block. Thus, each element as it is transferred by the pick-up tool is in a known, precisely predetermined orientation.

While there has been shown and described what are considered preferred embodiments of the present invention, it will be obvious to those skilled in the art that various changes and modifications may be made therein without departing from the invention as defined in the appended claims.

What is claimed is:

1. The method of producing semiconductor devices including the steps of:

providing a plurality of semiconductor elements supported in fixed position with respect to each other by supporting means;

placing said plurality of semiconductor elements on a supporting member with a fluid medium lying between the supporting member and the semiconductor elements;

freezing said fluid medium whereby the plurality of semiconductor elements are held in fixed position with respect to said supporting member;

separating a semiconductor element from the supporting means supporting the semiconductor element with respect to the other semiconductor elements of the plurality of semiconductor elements, whereby the semiconductor element is held in fixed position with respect to said supporting member only by the frozen fluid medium;

melting the frozen fluid medium adjacent the semiconductor element to free the semiconductor element from said supporting member while the remainder of the medium remains frozen holding the other semiconductor elements of the plurality in fixed position with respect to said supporting member; and moving the semiconductor element from adjacent the plurality of semiconductor elements.

2. The method of producing semiconductor devices in accordance with claim 1 wherein:

the steps of melting the frozen fluid medium adjacent the semiconductor element is performed by contacting the semiconductor element with a heated pick-up tool; and the step of moving the semiconductor element from adjacent the plurality of semiconductor elements is performed by gripping the semiconductor element with the pick-up tool and moving the pick-up tool.

3. The method of producing semiconductor devices in accordance with claim 2 and further including the steps of:

providing a mounting header comprising a member of nonconductive material having a group of conductive regions thereon;

transferring the semiconductor element to the mounting header; and electrically connecting the semiconductor element to conductive regions of the group of conductive regions.

4. The method of producing semiconductor devices including the steps of:

providing a body of semiconductor material having a plurality of regions, each region having the electrically active zones of a semiconductor element fabricated therein;

placing said body on a supporting member with a fluid medium lying between the supporting member and the body;

freezing said fluid medium whereby said body is held in fixed position with respect to the supporting member;

removing the semiconductor material of the body to leave discrete dice of semiconductor material, each die including the electrically active zones of a semiconductor element, whereby the dice are held in fixed position with respect to the supporting member and each other only by the frozen fluid medium;

melting the frozen fluid medium adjacent a semiconductor die to free the die from said supporting member while the remainder of the medium remains frozen holding the other semiconductor dice in fixed position with respect to said supporting member; and moving said semiconductor die from adjacent the other dice.

5. The method of producing semiconductor devices in accordance with claim 4 wherein:

the step of melting the frozen fluid medium adjacent a semiconductor die is performed by contacting the semiconductor die with a heated pick-up tool; and the step of moving said semiconductor die from adjacent the other dice is performed by gripping the semiconductor die with the pick-up tool and moving the pick-up tool.

6. The method of producing semiconductor devices in accordance with claim 5 and further including the steps of:

providing a mounting header comprising a member of nonconductive material having a group of conductive regions thereon;

transferring the semiconductor die to the mounting header; and electrically connecting the electrically active zones in the semiconductor die to conductive regions of the group of conductive regions.

7. The method of producing semiconductor devices including the steps of:

providing an array of semiconductor elements comprising a plurality of semiconductor elements supported in fixed relationship to each other by supporting structure;

placing the array of semiconductor elements on a supporting member with a fluid medium lying between the supporting member and the semiconductor elements;

freezing said fluid medium whereby the plurality of semiconductor elements are each held in fixed position with respect to said supporting member;

severing the supporting structure supporting one of said semiconductor elements in the array;

melting the frozen fluid medium adjacent said one semiconductor element to free said one semiconductor element from said supporting member while the remainder of the medium remains frozen holding the other semiconductor elements of the array fixed to the supporting member; and moving said one semiconductor element from adjacent the other semiconductor elements of the array.

8. The method of producing semiconductor devices in accordance with claim 7 wherein:

the steps of severing the supporting structure supporting one of said semiconductor elements in the array and melting the frozen fluid medium adjacent said one semiconductor element are performed in a single operation by engaging the one semiconductor element with a heated severing tool.

9. The method of producing semiconductor devices in accordance with claim 7 wherein:

the step of melting the frozen fluid medium adjacent said one semiconductor element is performed by contacting the semiconductor element with a heated pick-up tool; and the step of moving said one semiconductor element from adjacent the other semiconductor elements of the array is performed by gripping the semiconductor element with the pick-up tool and moving the pick-up tool.

10. The method of producing semiconductor devices in accordance with claim 9 and further iincluding the steps of:

providing an array of mounting headers comprising a member of nonconductive material having a plurality of groups of conductive regions thereon, each group of regions being arranged to provide the conductive portions of a mounting header for a semiconductor element, the groups of conductive regions being arranged on the member of nonconductive material in a predetermined pattern;

transferring said one semiconductor element to one of said mounting headers; and electrically connecting said one semiconductor element to the group of conductive regions of said one mounting header.

11. The method of producing semiconductor devices in accordance with claim 10 including:

continuing the steps of severing the supporting structure supporting a semiconductor element in the array, melting the frozen fluid medium adjacent the semiconductor element, transferring the semiconductor element to a mounting header, and electrically connecting the semiconductor element to the group of conductive regions of the mounting header to produce an array of mounted semiconductor elements arranged in a predetermined pattern.

12. The method of producing semiconductor devices including the steps of:

providing an array of semiconductor elements comprising a plurality of semiconductor elements supported in fixed relationship to each other by supporting structure;

placing the array of semiconductor elements on a supporting member with a fluid medium lying between the supporting member and the semiconductor elements;

freezing said fluid medium whereby the plurality of semiconductor elements are each held in fixed position with respect to said supporting member;

severing the supporting structure supporting each of said semiconductor elements in the array whereby said semiconductor elements are each held in fixed position with respect to the supporting member only by the frozen fluid medium;

melting the frozen fluid medium adjacent one of said semiconductor elements to free said one semiconductor element from said supporting member while the remainder of the medium remains frozen holding the other semiconductor elements fixed to the supporting member; and moving the one semiconductor element from adjacent the other semiconductor elements of the array.

References Cited

UNITED STATES PATENTS

| | | | |
|---|---|---|---|
| 2,865,082 | 12/1958 | Gates | 29—589 X |
| 2,984,897 | 5/1961 | Godfrey | 29—424 |
| 3,040,489 | 6/1962 | DaCosta. | |
| 3,152,939 | 10/1964 | Borneman et al. | |
| 3,387,359 | 6/1968 | Dale et al. | 29—577 |

JOHN F. CAMPBELL, Primary Examiner

R. B. LAZARUS, Assistant Examiner